(12) United States Patent
Hong (10) Patent No.: US 10,545,385 B2
(45) Date of Patent: Jan. 28, 2020

(54) DISPLAY DEVICE

(71) Applicant: SAMSUNG DISPLAY CO., LTD., Yongin-si, Gyeonggi-do (KR)

(72) Inventor: Sungchul Hong, Asan-si (KR)

(73) Assignee: Samsung Display Co., Ltd. (KR)

( * ) Notice: Subject to any disclaimer, the term of this patent is extended or adjusted under 35 U.S.C. 154(b) by 130 days.

(21) Appl. No.: 15/802,746

(22) Filed: Nov. 3, 2017

(65) Prior Publication Data
US 2018/0129093 A1 May 10, 2018

(30) Foreign Application Priority Data
Nov. 4, 2016 (KR) .................. 10-2016-0146754

(51) Int. Cl.
| | | |
|---|---|---|
| H01L 27/32 | (2006.01) | |
| G02F 1/1345 | (2006.01) | |
| G02F 1/1333 | (2006.01) | |
| G02F 1/1362 | (2006.01) | |
| G06F 3/044 | (2006.01) | |
| G09G 3/36 | (2006.01) | |

(52) U.S. Cl.
CPC .... *G02F 1/13454* (2013.01); *G02F 1/133345* (2013.01); *G02F 1/136213* (2013.01); *G02F 1/136286* (2013.01); *G06F 3/044* (2013.01); *G09G 3/36* (2013.01); *H01L 27/3248* (2013.01); *G09G 2310/0267* (2013.01); *G09G 2310/0286* (2013.01); *G09G 2320/0209* (2013.01)

(58) Field of Classification Search
CPC ............. G02F 1/1345; G02F 1/133345; G02F 1/136286; G02F 1/136213; G02F 1/13454; H01L 27/3248; H01L 27/3276; G06F 3/044; G09G 3/36; G09G 3/3677
See application file for complete search history.

(56) References Cited

U.S. PATENT DOCUMENTS

| | | | |
|---|---|---|---|
| 9,208,738 B2 | 12/2015 | Kwon et al. | |
| 9,666,607 B2 | 5/2017 | Kim et al. | |
| 2006/0092929 A1* | 5/2006 | Chun | G06F 1/10 370/362 |
| 2011/0074745 A1 | 3/2011 | Chang et al. | |

(Continued)

FOREIGN PATENT DOCUMENTS

| | | |
|---|---|---|
| KR | 10-2011-0033661 | 3/2011 |
| KR | 10-2012-0062356 | 6/2012 |

(Continued)

*Primary Examiner* — Towfiq Elahi
(74) *Attorney, Agent, or Firm* — Innovation Counsel LLP (57) ABSTRACT

A display device includes a gate line, a gate driver, a clock-signal structure, and a connection structure. The gate driver is electrically connected to the gate line. The clock line may transmit a clock signal and includes a plurality of clock members and a first linking member. The first linking member electrically connects the plurality of clock members to each other and is angled relative to each of the plurality of clock members. The connection structure electrically connects the clock-signal structure and the gate driver and includes a plurality of connection members and a second linking member. The second linking member electrically connects the plurality of connection members to each other, is angled relative to each of the plurality of connection members, and crosses the first linking member.

18 Claims, 5 Drawing Sheets

(56) References Cited

U.S. PATENT DOCUMENTS

2012/0139881 A1\* 6/2012 Kwon .................. G09G 3/3677
345/204
2016/0172430 A1 6/2016 Park et al.

FOREIGN PATENT DOCUMENTS

KR   10-2014-0098949   8/2014
KR   10-2014-0104263   8/2014

\* cited by examiner

DISPLAY DEVICE

CROSS-REFERENCE TO RELATED APPLICATION

This application claims priority under 35 U.S.C. § 119 to Korean Patent Application No. 10-2016-0146754, filed on Nov. 4, 2016, in the Korean Intellectual Property Office (KIPO); the disclosure of the Korean Patent Application is incorporated by reference herein in its entirety.

BACKGROUND

1. Technical Field

The technical field is related to a display device.

2. Discussion of Related Art

Display devices may display images using elements that emit light. Display devices may include liquid crystal display (LCD) devices, organic light emitting diode (OLED) display devices, plasma display panel (PDP) display devices, and electrophoretic display devices.

In general, a display device includes a plurality of pixels, a data driver for applying data voltages to the pixels, and a gate driver for applying gate signals to control transmission of the data voltages.

This background section is intended to provide useful background for understanding the technology. The technology background member may include information that is not known or appreciated by those skilled in the pertinent art prior to a corresponding effective filing date of subject matter disclosed herein.

SUMMARY

Embodiments may be directed to a display device capable of maximizing charge transfer efficiency between a clock line (and/or a clock-signal structure) and a gate driver and/or capable of minimizing heat generation in a non-display area.

According to an embodiment, a display device includes the following elements: a substrate; a gate line extending along a first direction on the substrate; a gate driver connected to the gate line; a clock line transmitting a clock signal; a plurality of clock members extending from the clock line; a first linking member connecting the plurality of clock members to each other; a connection line connecting the clock line and the gate driver; a plurality of connection members extending from the connection line; and a second linking member connecting the plurality of connection members to each other. The first linking member and the second linking member cross each other on a plane.

The plurality of clock members may not overlap the plurality of connection members.

The first linking member and the second linking member may have a zigzag shape.

The plurality of clock members may be arranged alternately on left and right sides with respect to the first linking member and the second linking member.

The plurality of connection members may be arranged alternately on left and right sides with respect to the first linking member and the second linking member.

The display device may further include: a gate insulating layer on the substrate, the clock line, the plurality of clock members and the first linking member; a protective layer on the gate insulating layer, the connection line, the plurality of connection members and the second linking member; and a conductive layer overlapping the plurality of clock members and the plurality of connection members.

The gate insulating layer and the protective layer may have a plurality of gate contact holes exposing at least a portion of the plurality of clock members, and the conductive layer may contact the plurality of clock members through the plurality of gate contact holes.

Each of the plurality of clock members may overlap the plurality of gate contact holes.

The protective layer may have a plurality of source contact holes exposing at least a portion of the plurality of connection members, and the conductive layer may contact the plurality of connection members through the plurality of source contact holes.

Each of the plurality of connection members may overlap the plurality of source contact holes.

A width of the clock line may be less than a width of the clock member.

A ratio between a width of the clock line and a width of the clock member may be in a range from about 1:2 to about 1:10.

The width of the clock line may be in a range from about 20 µm to about 30 µm.

The clock line, the plurality of clock members, the first linking member and the gate line may be arranged on a substantially same layer.

An embodiment may be related to a display device. The display device may include a substrate, a gate driver, a clock-signal structure, and a connection structure. The gate line may extend in a first direction and may overlap the substrate. The gate driver may be electrically connected to the gate line. The clock-signal structure may transmit a clock signal and may include a plurality of clock members and a first linking member. The first linking member may electrically connect the plurality of clock members to each other, and may be angled relative to the plurality of clock members. The connection structure may electrically connect the clock-signal structure and the gate driver and may include a plurality of connection members and a second linking member. The second linking member may electrically connect the plurality of connection members to each other, may be angled relative to the plurality of connection members, and may cross the first linking member in a plan view of the display device.

Each of the plurality of clock members may be spaced from each of the plurality of connection members in the plan view of the display device.

The first linking member may be oblique relative to each of the plurality of clock members.

The display device may include the following elements: a gate insulating layer directly contacting each of the substrate and the clock-signal structure; a protective layer directly contacting each of the gate insulating layer and the connection structure; and a conductive layer directly contacting each of the plurality of clock members and the plurality of connection member.

The gate insulating layer and the protective layer may have a plurality of first-type contact holes. The conductive layer may contact the plurality of clock members through the first-type contact holes.

Portions of the conductive layer may be respectively positioned inside the first-type contact holes.

The protective layer may have a plurality of second-type contact holes. The conductive layer may contact the plurality of connection members through the second-type source contact holes.

Parts of the conductive layer may be respectively positioned inside the second-type contact holes.

The clock-signal structure may include a clock line. A width of the clock line in the first direction may be less than a width of one of the plurality of clock members in the first direction.

A ratio between the width of the clock line in the first direction and the width of one of the plurality of clock members in the first direction may be in a range from 1:2 to 1:10.

The width of the clock line in the first direction may be in a range from 20 μm to 30 μm.

The clock-signal structure may directly contact a face of the substrate. The gate line may directly contact the face of the substrate.

The plurality of clock members may extend parallel to one another, and may not be aligned with one another in the first direction in a plan view of the display device.

The plurality of connection members may extend parallel to one another, and may be not aligned with one another in the first direction in a plan view of the display device.

The plurality of clock members may extend parallel to one another, and may be respectively aligned with the plurality of connection members in the first direction in the plan view of the display device.

The plurality of clock members and the plurality of connection members may be alternately disposed in a second direction perpendicular to the first direction in the plan view of the display device.

DETAILED DESCRIPTION

Example embodiments are described with reference to the accompanying drawings. The example embodiments may be modified in various manners.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first", "second", etc. may represent "first-type (or first-set)," "second-type (or second-set)," etc., respectively.

In the drawings, thicknesses of layers may be illustrated in an enlarged manner for clarity and/or ease of description.

When a first element is referred to as being "on" a second element, the first element may be directly on the second element, or one or more intervening elements may be present between the first element and the second element. When a first element is referred to as being "directly on" a second element, no intended intervening elements (except for environment elements such as air) may be present between the first element and the second element.

The spatially relative terms "below", "beneath", "lower", "above", "upper" and the like, may be used herein for ease of description to describe the relations between one element and another element as illustrated in the drawings. The spatially relative terms may encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

When a first element is referred to as being "connected" to a second element, the first element may be "directly connected," "indirectly connected," and/or "electrically connected" to the second element through one or more intervening elements.

The terms "comprises," "including," "includes," and/or "including" may specify the presence of stated features, integers, steps, operations, elements, and/or components, but may not preclude the presence or addition of one or more other features, integers, steps, operations, elements, components and/or groups.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. Terms, such as those defined in commonly used dictionaries, should be interpreted as having a meaning that is consistent with their meaning in the context of the relevant art and will not be interpreted in an ideal or excessively formal sense unless clearly defined in the present specification.

Like reference numerals may refer to like elements.

Figure 1:
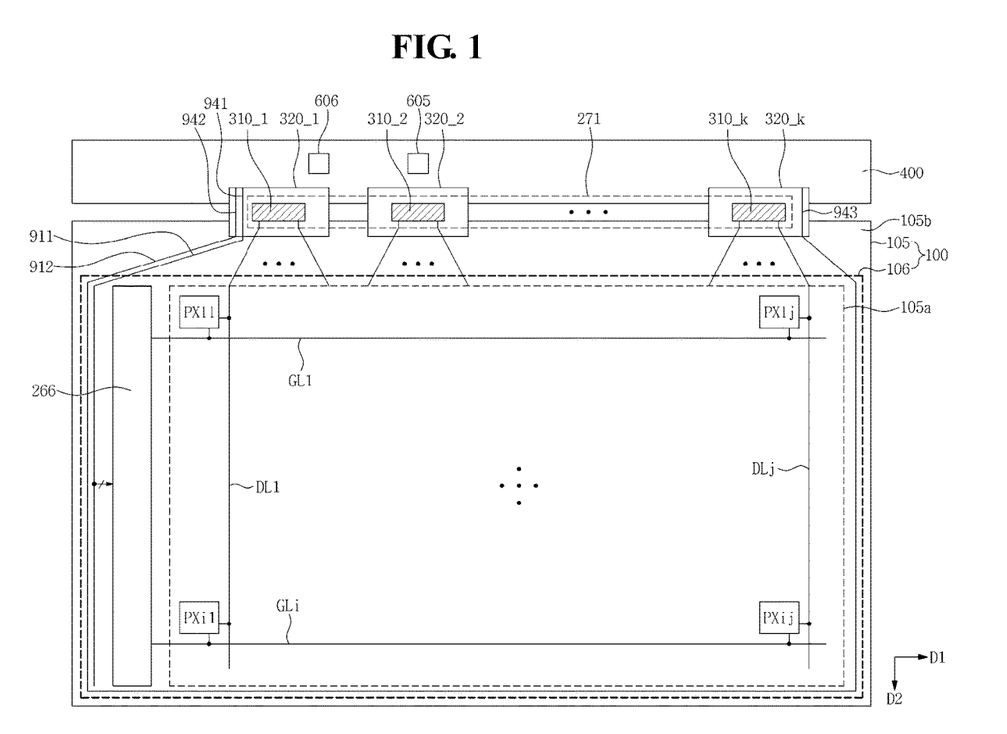
FIG. 1 is a plan view illustrating a display device according to an embodiment.

FIG. 1 is a plan view illustrating a display device according to an embodiment.

Referring to FIG. 1, the display device includes a display panel 100, a data driver 271, a gate driver 266, a circuit board 400, a timing controller 606, and a power supply unit 605.

The display panel 100 includes a first panel 105 and a second panel 106. The first panel 105 and the second panel 106 overlap each other. The first panel 105 includes a display area 105a and a non-display area 105b.

The display panel 100 may be, for example, a liquid crystal display (LCD) panel or an organic light emitting diode (OLED) panel. In the case that the display panel 100 is an LCD panel, a liquid crystal layer may be disposed between the first panel 105 and the second panel 106. In the case that the display panel 100 is an OLED panel, an organic light emitting layer may be disposed between the first panel 105 and the second panel 106.

The first panel 105 includes a plurality of gate lines GL1 to GLi extending in a first direction D1, a plurality of data lines DL1 to DLj extending in a second direction D2 intersecting the first direction D1, a common line 912, and a plurality of pixels PX11 to PXij. The gate lines GL1 to GLi, the data lines, DLj and the pixels PX11 to PXij (including PX1j and PXi1) are located on a first substrate 401 (see FIG. 4) of the first panel 105.

The second panel 106 includes a light blocking/shielding layer 476 (see FIG. 4) which defines a pixel area. In an embodiment, the light blocking layer 476 may be located on the first panel 105. The light blocking layer 476 prevents unwanted light emission.

The data lines DL1 to DLj intersect the gate lines GL1 to GLi. The data lines DL1 to DLj extend to the non-display area 105b to be connected to the data driver 271.

The data driver 271 includes a plurality of data driving integrated circuits ("ICs") 310_1, 310_2, . . . and 310_k. The data driving ICs 310_1, 310_2, . . . and 310_k receive digital image data signals and a data control signal applied from a timing controller 606. The data driving ICs 310_1, 310_2, . . . and 310_k sample the digital image data signals according to the data control signal, latch the sampled digital image data signals corresponding to one horizontal line in each horizontal period and apply the latched image data signals to the data lines DL1 to DLj. The data driving ICs 310_1, 310_2, . . . and 310_k may convert the digital image data signals applied from the timing controller 606 into analog image signals using a gamma voltage input from a power supply unit 605 and may apply the converted analog image signals to the data lines DL1 to DLj.

The data driving ICs 310_1, 310_2, . . . and 310_k are mounted on data carriers 320_1, 320_2, . . . and 320_k, respectively. The data carriers 320_1, 320_2, . . . and 320_k are connected between the circuit board 400 and the display panel 105. For example, each of the data carriers 320_1, 320_2, . . . and 320_k may be electrically connected between the circuit board 400 and the non-display area 105b of the display panel 105.

The timing controller 606 and the power supply unit 605 may be disposed on the circuit board 400.

The data carriers 320_1, 320_2, . . . and 320_k include input lines for transmitting various signals applied from the timing controller 606 and the power supply unit 605 to the data driving ICs 310_1, 310_2, . . . and 310_k and include output lines for transmitting image data signals output from the data driving ICs 310_1, 310_2, . . . and 310_k to the corresponding ones of the data lines DL1 to DLj.

A data carrier at a leftmost edge, e.g., the data carrier 320_1, may include a first auxiliary line 941 and a second auxiliary line 942 for transmitting various signals and a common voltage applied from the timing controller 606 and the power supply unit 605 to the first panel 105.

A data carrier at a rightmost edge, e.g., the data carrier 320_k, may include a third auxiliary line 943 for transmitting the common voltage applied from the power supply unit 605 to the first panel 105.

The first auxiliary line 941 is connected to a gate control line 911 of the first panel 105. The gate control line 911 transmits various signals applied through the first auxiliary line 941 to the gate driver 266.

The common line 912 transmits the common voltage applied from the second and third auxiliary lines 942 and 943 to a common electrode of the second panel 106. The common line 912 may enclose three sides of the display area 105a. The common electrode of the second panel 106 is connected to the common line 912 of the first panel 105 through a short-circuit unit (not illustrated). The common electrode receives the common voltage from the common line 912 through the short-circuit unit.

The gate control line 911 and the common line 912 may be formed in the non-display area 105b of the first panel 105 in a line-on-glass structure.

The pixels PX11 to PXij are arranged in a matrix in the display area 105a of the first panel 105. The pixels PX11 to PXij may include a red pixel displaying a red color, a green pixel displaying a green color, and a blue pixel displaying a blue color. In an embodiment, the red pixel, the green pixel, and the blue pixel that are adjacently disposed in a horizontal direction may define a unit pixel for displaying a unit image.

There are "j" number of pixels arranged along a $p^{th}$ (p being one selected from 1 to i) horizontal line (hereinafter, $p^{th}$ horizontal line pixels), which are connected to the first to $j^{th}$ data lines DL1 to DLj, respectively. Further, the $p^{th}$ horizontal line pixels are connected to the $p^{th}$ gate line in common. Accordingly, the $p^{th}$ horizontal line pixels receive a $p^{th}$ gate signal as a common signal. That is, "j" number of pixels disposed in the same horizontal line receive the same gate signal, while pixels disposed in different horizontal lines receive different gate signals, respectively.

Each of the pixels PX11 to PXij, although not illustrated, may include a pixel transistor, a liquid crystal capacitor, and a storage capacitor. The pixel transistor is a thin film transistor, for example.

The pixel transistor is turned on according to a gate signal applied from the gate line. The turned-on pixel transistor applies the analog image data signal applied from the data line to the liquid crystal capacitor and the storage capacitor.

The liquid crystal capacitor includes a pixel electrode and a common electrode which overlap each other.

The storage capacitor includes a pixel electrode and an opposing electrode which overlap each other. Herein, the opposing electrode may be a previous gate line or a transmission line which transmits the common voltage.

The gate lines GL1 to GLi are driven by the gate driver 266 and the gate driver 266 includes a shift register.

Figure 2:
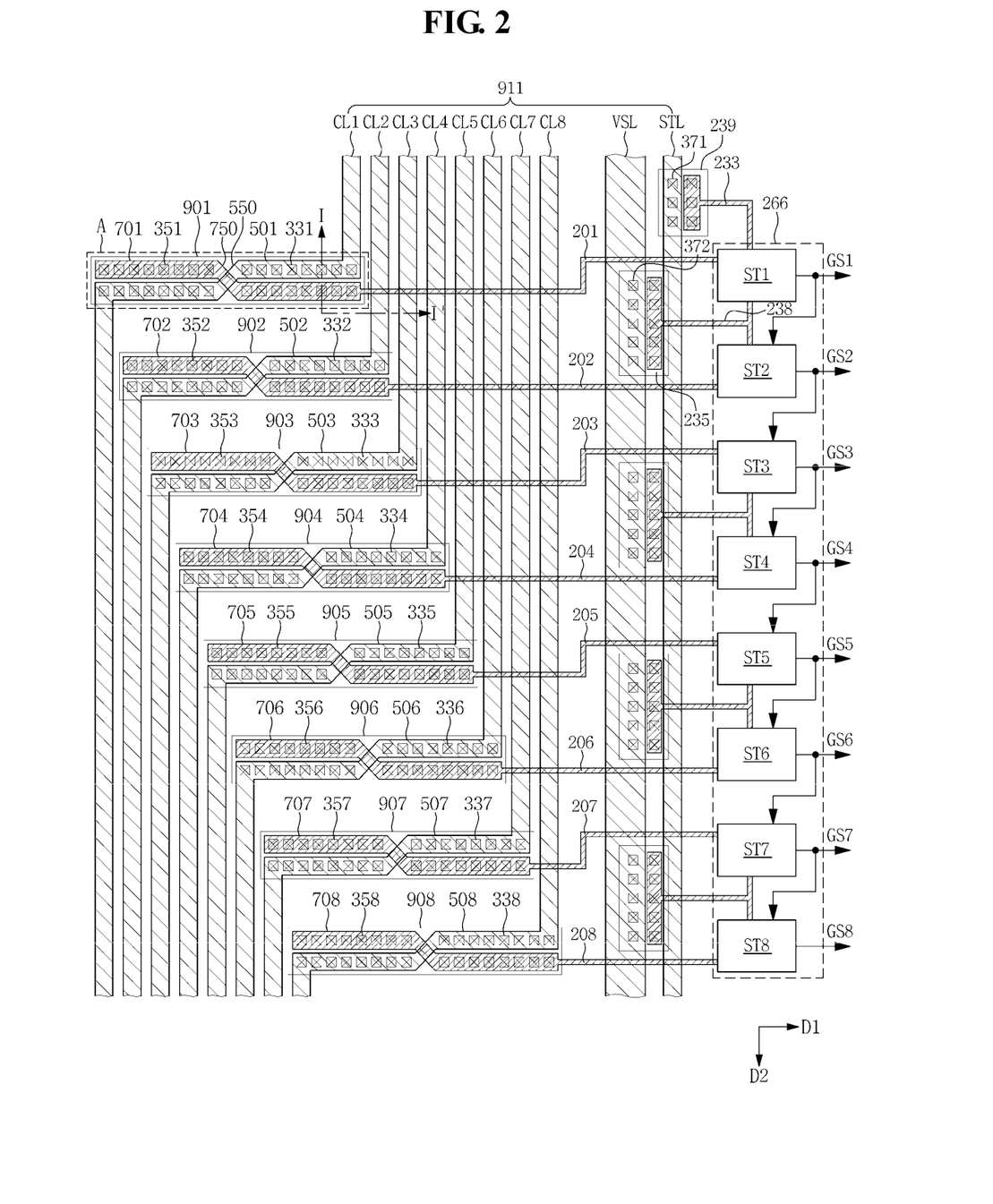
FIG. 2 is a plan view illustrating a connection relationship between a gate control line and a gate driver of FIG. 1 according to an embodiment.
Figure 3:
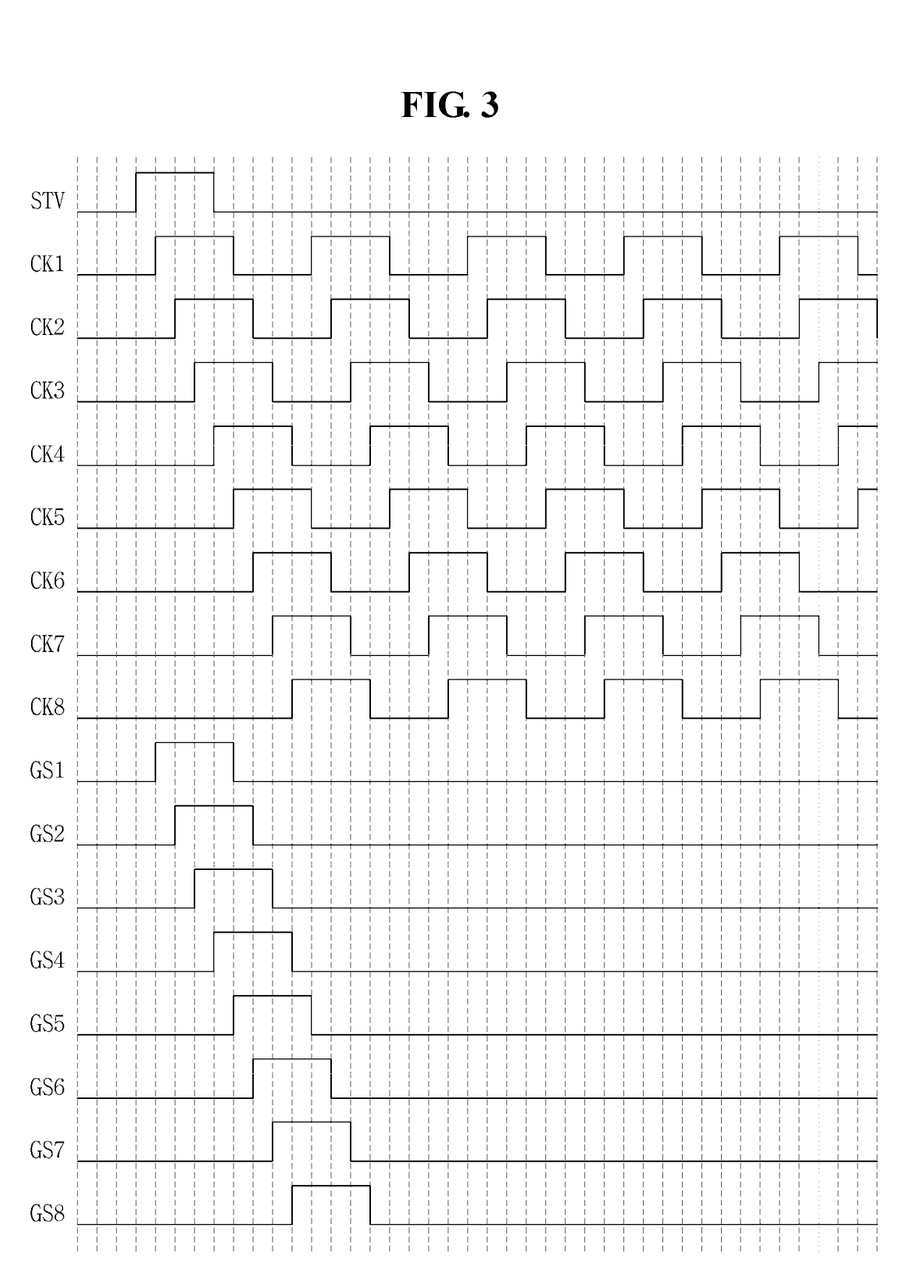
FIG. 3 is a view illustrating waveforms of various signals applied to the gate control line of FIG. 2 and gate signals output from the gate driver of FIG. 2 according to an embodiment.
Figure 4:
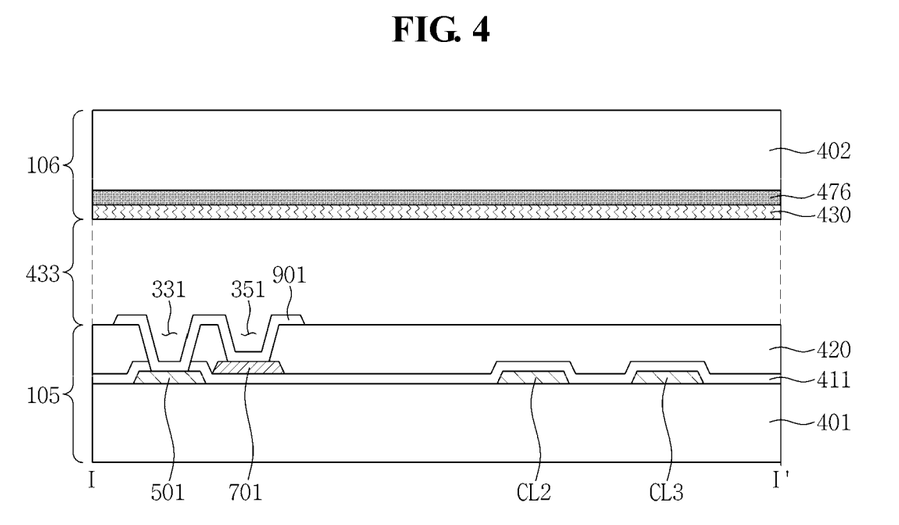
FIG. 4 is a cross-sectional view taken along line I-I' of FIG. 2 according to an embodiment.

FIG. 2 is a plan view illustrating a connection relationship between a gate control line and a gate driver of FIG. 1, and a portion of the gate control line 911 and a portion of the gate driver 266 are illustrated in FIG. 2. FIG. 3 is a view illustrating waveforms of various signals applied to the gate control line of FIG. 2 and gate signals output from the gate driver of FIG. 2, and FIG. 4 is a cross-sectional view taken along line I-I' of FIG. 2.

Referring to FIG. 2, the gate control line 911 includes a first clock line CL1, a second clock line CL2, a third clock line CL3, a fourth clock line CL4, a fifth clock line CL5, a sixth clock line CL6, a seventh clock line CL7, an eighth clock line CL8, a base line VSL, and a start line STL.

Referring to FIG. 2 and FIG. 3, the first, second, third, fourth, fifth, sixth, seventh and eighth clock lines CL1, CL2, CL3, CL4, CL5, CL6, CL7 and CL8 transmit first, second, third, fourth, fifth, sixth, seventh and eighth clock signals CK1, CK2, CK3, CK4, CK5, CK6, CK7 and CK8, respectively, and the start line STL transmits a start vertical signal STV. The first, second, third, fourth, fifth, sixth, seventh and eighth clock signals CK1, CK2, CK3, CK4, CK5, CK6, CK7 and CK8 and the start vertical signal STV are applied from the timing controller 606. A high voltage of each of the first, second, third, fourth, fifth, sixth, seventh and eighth clock signals CK1, CK2, CK3, CK4, CK5, CK6, CK7 and CK8 corresponds to a high voltage of the gate signal.

The first, second, third, fourth, fifth, sixth, seventh and eighth clock signals CK1, CK2, CK3, CK4, CK5, CK6, CK7 and CK8 are output sequentially and in particular, are output recursively. That is, the first, second, third, fourth, fifth, sixth, seventh and eighth clock signals CK1, CK2, CK3, CK4, CK5, CK6, CK7 and CK8 are output sequentially from the first clock signal CK1 to the eighth clock signal CK8 and output once again from the first clock signal CK1 to the eighth clock signal CK8 sequentially.

High periods of the clock signals that are output in adjacent periods may overlap each other. For example, as illustrated in FIG. 3, a period corresponding to latter three fourths of a pulse width of the first clock signal CK1 and a period corresponding to former three fourths of a pulse width of the second clock signal CK2 overlap each other in time.

In addition, the fifth, sixth, seventh and eighth clock signals CK5, CK6, CK7 and CK8 have phases that are inverted, i.e., shifted by 180 degrees, with respect to the first, second, third and fourth clock signals CK1, CK2, CK3 and CK4, respectively. For example, the fifth clock signal CK5 is inverted, i.e., shifted by 180 degrees, with respect to the first clock signal CK1, the sixth clock signal CK6 is inverted, i.e., shifted by 180 degrees, with respect to the second clock signal CK2, the seventh clock signal CK7 is inverted, i.e., shifted by 180 degrees, with respect to the third clock signal CK3 and the eighth clock signal CK8 is inverted, i.e., shifted by 180 degrees, with respect to the fourth clock signal CK4.

While each of the first, second, third, fourth, fifth, sixth, seventh and eighth clock signals CK1, CK2, CK3, CK4, CK5, CK6, CK7 and CK8 is output a plurality of times in a single frame period, the start vertical signal STV is output only once in a single frame period. In other words, while each of the first, second, third, fourth, fifth, sixth, seventh and eighth clock signals CK1, CK2, CK3, CK4, CK5, CK6, CK7 and CK8 has an active state (high voltage) a plurality of times periodically in a single frame, the start vertical signal STV has an active state (high voltage) only once in a single frame period.

The gate driver 266, as illustrated in FIG. 1, is located in the non-display area 105b of the first panel 105. The gate driver 266 includes a shift register. The shift register includes a plurality of stages ST1, ST2, ST3, ST4, ST5, ST6, ST7 and ST8.

Each of the stages ST1, ST2, ST3, ST4, ST5, ST6, ST7 and ST8 receives one of the first, second, third, fourth, fifth, sixth, seventh and eighth clock signals CK1, CK2, CK3, CK4, CK5, CK6, CK7 and CK8 to thereby generate first, second, third, fourth, fifth, sixth, seventh and eighth gate signals GS1, GS2, GS3, GS4, GS5, GS6, GS7 and GS8. An $8m+1^{th}$ stage (e.g., a stage ST1) receives the first clock signal CK1 to thereby generate a first gate signal GS1, an $8m+2^{th}$ stage (e.g., a stage ST2) receives the second clock signal CK2 to thereby generate a second gate signal GS2, an $8m+3^{th}$ stage (e.g., a stage ST3) receives the third clock signal CK3 to thereby generate a third gate signal GS3, an $8m+4^{th}$ stage (e.g., a stage ST4) receives the fourth clock signal CK4 to thereby generate a fourth gate signal GS4, an $8m+5^{th}$ stage (e.g., a stage ST5) receives the fifth clock signal CK5 to thereby generate a fifth gate signal GS5, an $8m+6^{th}$ stage (e.g., a stage ST6) receives the sixth clock signal CK6 to thereby generate a sixth gate signal GS6, an $8m+7^{th}$ stage (e.g., a stage ST7) receives the seventh clock signal CK7 to thereby generate a seventh gate signal GS7 and an $8m+8^{th}$ stage (e.g., a stage ST8) receives the eighth clock signal CK8 to thereby generate an eighth gate signal GS8. Herein, "m" is a natural number and includes 0.

Each of the stages ST1, ST2, ST3, ST4, ST5, ST6, ST7 and ST8 receives the gate signal applied from a previous stage as an initiating signal and thereby is set. The stage that is set outputs, as a gate signal, the clock signal that is applied to the corresponding stage that is set. For example, the second stage ST2 receives the first gate signal GS1 from the first stage ST1 as an initiating signal and is set. The second stage ST2 that is set receives the second clock signal CK2 and outputs the second gate signal GS2.

Although not illustrated, each of the stages ST1, ST2, ST3, ST4, ST5, ST6, ST7 and ST8 receives the gate signal applied from a succeeding stage and thereby is reset.

The first stage ST1 which is driven firstly in each frame period receives the start vertical signal STV as an initiating signal. In addition, although not illustrated, a stage that is driven lastly in each frame period also receives the start vertical signal STV. The stage that is driven lastly in each frame period receives the start vertical signal STV and thereby is reset.

As described above, the gate driver 266 may receive clock signals of eight phases, e.g., the first, second, third, fourth, fifth, sixth, seventh and eighth clock signals CK1, CK2, CK3, CK4, CK5, CK6, CK7 and CK8, but the number of phases of the clock signal is not limited thereto. That is, the gate driver 266 may receive clock signals of "q" number of phases, where "q" is a natural number greater than 1.

Referring to FIGS. 2 and 4, the first clock line CL1 is connected to the gate driver 266 through a first connection line 201 and a first conductive layer 901. For example, the first connection line 201 connects the first clock line CL1 and the first stage ST1 of the gate driver 266. The first clock line CL1 transmits the first clock signal CK1.

The display device includes a plurality of first clock members 501 extending from the first clock line CL1 and a first linking member 550 connecting the plurality of first clock members 501 to each other. For example, as illustrated in FIG. 2, the gate control line 911 may include the first clock line CL1, two first clock members 501 and the first linking member 550. The elements CL1, 501, and 550 may form a clock-signal structure for transmitting a clock signal.

In an embodiment, the display device includes a plurality of first connection members 701 extending from the first connection line 201 and a second linking member 750 connecting the plurality of first connection members 701 to each other. For example, as illustrated in FIG. 2, the display device may include the first connection line 201, two first connection members 701 and the second linking member 750. The elements 201, 701, and 750 may form a connection structure for electrically connecting the clock-signal structure and the gate driver 266.

In an embodiment, the first clock line CL1, the first clock members 501, and the first linking member 550 are integrally formed (e.g., into a monolithic/continuous clock-signal structure). In an embodiment, the first connection line 201, the first connection members 701, and the second linking member 750 are integrally formed (e.g., into a monolithic/continuous connection structure).

As illustrated in FIG. 4, a first clock member 501 and a first connection member 701 are located on different layers. The first clock member 501 and the first connection member 701 are electrically connected by the first conductive layer 901. A portion of the first conductive layer 901 is directly connected to the first clock member 501 through a first gate contact hole 331 (a first-type contact hole) and another portion of the first conductive layer 901 is directly connected to the first connection member 701 through a first source contact hole 351 (a second-type contact hole). The first gate contact hole 331 penetrates a gate insulating layer 411 and a protective layer 420. The first clock member 501 is exposed by the first gate contact hole 331. The first source contact hole 351 penetrates the protective layer 420. The first connection member 701 is exposed by the first source contact hole 351.

As illustrated in FIG. 2, the second clock line CL2 is connected to the gate driver 266 through a second connection line 202 and a second conductive layer 902. For example, the second connection line 202 connects the second clock line CL2 and the second stage ST2 of the gate driver 266. The second clock line CL2 transmits the second clock signal CK2.

The display device includes a plurality of second clock members 502 extending from the second clock line CL2 and a first linking member 550 connecting the plurality of second clock members 502 to each other. For example, the display device may include the second clock line CL2, two second clock members 502 and the first linking member 550.

In an embodiment, the display device further includes a plurality of second connection members 702 extending from the second connection line 202 and a second linking member 750 connecting the plurality of second connection members 702 to each other. For example, the display device may include the second connection line 202, two second connection members 702 and the second linking member 750.

In an embodiment, the second clock line CL2, the second clock members 502 and the first linking member 550 are integrally formed (e.g., into a monolithic structure). In an embodiment, the second connection line 202, the second connection members 702 and the second linking member 750 are integrally formed (e.g., into a monolithic structure).

The second clock members 502 and the second connection members 702 are located on different layers. The second clock members 502 and the second connection members 702 are connected by a second conductive layer 902. A portion of the second conductive layer 902 is connected to the second clock member 502 through a second gate contact hole 332 and another portion of the second conductive layer 902 is connected to the second connection member 702 through a second source contact hole 352. The second gate contact hole 332 penetrates the gate insulating layer 411 and the protective layer 420. The second clock member 502 is exposed by the second gate contact hole 332. The second source contact hole 352 penetrates the protective layer 420. The second connection member 702 is exposed by the second source contact hole 352.

As illustrated in FIG. 2, the third clock line CL3 is connected to the gate driver 266 through a third connection line 203 and a third conductive layer 903. For example, the third connection line 203 connects the third clock line CL3 and the third stage ST3 of the gate driver 266. The third clock line CL3 transmits the third clock signal CK3.

The display device includes a plurality of third clock members 503 extending from the third clock line CL3 and a first linking member 550 connecting the plurality of third clock members 503 to each other. For example, the display device may include the third clock line CL3, two third clock members 503 and the first linking member 550.

In an embodiment, the display device further includes a plurality of third connection members 703 extending from the third connection line 203 and a second linking member 750 connecting the plurality of third connection members 703 to each other. For example, the display device may include the third connection line 203, two third connection members 703 and the second linking member 750.

In an embodiment, the third clock line CL3, the third clock members 503 and the first linking member 550 are integrally formed (e.g., into a monolithic structure). In an embodiment, the third connection line 203, the third connection member 703 and the second linking members 750 are integrally formed (e.g., into a monolithic structure).

The third clock members 503 and the third connection members 703 are located on different layers. The third clock members 503 and the third connection members 703 are connected by a third conductive layer 903. A portion of the third conductive layer 903 is connected to the third clock member 503 through a third gate contact hole 333 and another portion of the third conductive layer 903 is connected to the third connection member 703 through a third source contact hole 353. The third gate contact hole 333 penetrates the gate insulating layer 411 and the protective layer 420. The third clock member 503 is exposed by the third gate contact hole 333. The third source contact hole 353 penetrates the protective layer 420. The third connection member 703 is exposed by the third source contact hole 353.

As illustrated in FIG. 2, the fourth clock line CL4 is connected to the gate driver 266 through a fourth connection line 204 and a fourth conductive layer 904. For example, the fourth connection line 204 connects the fourth clock line CL4 and the fourth stage ST4 of the gate driver 266. The fourth clock line CL4 transmits the fourth clock signal CK4.

The display device includes a plurality of fourth clock members 504 extending from the fourth clock line CL4 and a first linking member 550 connecting the plurality of fourth clock members 504 to each other. For example, the display device may include the fourth clock line CL4, two fourth clock members 504 and the first linking member 550.

In an embodiment, the display device further includes a plurality of fourth connection members 704 extending from the fourth connection line 204 and a second linking member 750 connecting the plurality of fourth connection members 704 to each other. For example, the display device may include the fourth connection line 204, two fourth connection members 704 and the second linking member 750.

In an embodiment, the fourth clock line CL4, the fourth clock members 504 and the first linking member 550 are integrally formed (e.g., into a monolithic structure). In an embodiment, the fourth connection line 204, the fourth connection members 704 and the second linking member 750 are integrally formed (e.g., into a monolithic structure).

The fourth clock members 504 and the fourth connection members 704 are located on different layers. The fourth clock members 504 and the fourth connection members 704 are connected by a fourth conductive layer 904. A portion of the fourth conductive layer 904 is connected to the fourth clock member 504 through a fourth gate contact hole 334 and another portion of the fourth conductive layer 904 is connected to the fourth connection member 704 through a fourth source contact hole 354. The fourth gate contact hole 334 penetrates the gate insulating layer 411 and the protective layer 420. The fourth clock member 504 is exposed by the fourth gate contact hole 334. The fourth source contact hole 354 penetrates the protective layer 420. The fourth connection member 704 is exposed by the fourth source contact hole 354.

As illustrated in FIG. 2, the fifth clock line CL5 is connected to the gate driver 266 through a fifth connection line 205 and a fifth conductive layer 905. For example, the fifth connection line 205 connects the fifth clock line CL5 and the fifth stage ST5 of the gate driver 266. The fifth clock line CL5 transmits the fifth clock signal CK5.

The display device includes a plurality of fifth clock members 505 extending from the fifth clock line CL5 and a first linking member 550 connecting the plurality of fifth clock members 505 to each other. For example, the display device may include the fifth clock line CL5, two fifth clock members 505 and the first linking member 550.

In an embodiment, the display device further includes a plurality of fifth connection members 705 extending from the fifth connection line 205 and a second linking member 750 connecting the plurality of fifth connection members 705 to each other. For example, the display device may include the fifth connection line 205, two fifth connection members 705 and the second linking member 750.

In an embodiment, the fifth clock line CL5, the fifth clock members 505 and the first linking member 550 are integrally formed (e.g., into a monolithic structure). In an embodiment, the fifth connection line 205, the fifth connection members 705 and the second linking member 750 are integrally formed (e.g., into a monolithic structure).

The fifth clock members 505 and the fifth connection members 705 are located on different layers. The fifth clock members 505 and the fifth connection members 705 are connected by a fifth conductive layer 905. A portion of the fifth conductive layer 905 is connected to the fifth clock member 505 through a fifth gate contact hole 335 and another portion of the fifth conductive layer 905 is connected to the fifth connection member 705 through a fifth source contact hole 355. The fifth gate contact hole 335 penetrates the gate insulating layer 411 and the protective layer 420. The fifth clock member 505 is exposed by the fifth gate contact hole 335. The fifth source contact hole 355 penetrates the protective layer 420. The fifth connection member 705 is exposed by the fifth source contact hole 355.

As illustrated in FIG. 2, the sixth clock line CL6 is connected to the gate driver 266 through a sixth connection line 206 and a sixth conductive layer 906. For example, the sixth connection line 206 connects the sixth clock line CL6 and the sixth stage ST6 of the gate driver 266. The sixth clock line CL6 transmits the sixth clock signal CK6.

The display device includes a plurality of sixth clock members 506 extending from the sixth clock line CL6 and a first linking member 550 connecting the plurality of sixth clock members 506 to each other. For example, the display device may include the sixth clock line CL6, two sixth clock members 506 and the first linking member 550.

In an embodiment, the display device further includes a plurality of sixth connection members 706 extending from the sixth connection line 206 and a second linking member 750 connecting the plurality of sixth connection members 706 to each other. For example, the display device may include the sixth connection line 206, two sixth connection members 706 and the second linking member 750.

In an embodiment, the sixth clock line CL6, the sixth clock members 506 and the first linking member 550 are integrally formed (e.g., into a monolithic structure). In an embodiment, the sixth connection line 206, the sixth connection members 706 and the second linking member 750 are integrally formed (e.g., into a monolithic structure).

The sixth clock members 506 and the sixth connection members 706 are located on different layers. The sixth clock members 506 and the sixth connection members 706 are connected by a sixth conductive layer 906. A portion of the sixth conductive layer 906 is connected to the sixth clock member 506 through a sixth gate contact hole 336 and another portion of the sixth conductive layer 906 is connected to the sixth connection member 706 through a sixth source contact hole 356. The sixth gate contact hole 336 penetrates the gate insulating layer 411 and the protective layer 420. The sixth clock member 506 is exposed by the sixth gate contact hole 336. The sixth source contact hole 356 penetrates the protective layer 420. The sixth connection member 706 is exposed by the sixth source contact hole 356.

As illustrated in FIG. 2, the seventh clock line CL7 is connected to the gate driver 277 through a seventh connection line 207 and a seventh conductive layer 907. For example, the seventh connection line 207 connects the seventh clock line CL7 and the seventh stage ST7 of the gate driver 277. The seventh clock line CL7 transmits the seventh clock signal CK7.

The display device includes a plurality of seventh clock members 507 extending from the seventh clock line CL7 and a first linking member 550 connecting the plurality of seventh clock members 507 to each other. For example, the display device may include the seventh clock line CL7, two seventh clock members 507 and the first linking member 550.

In an embodiment, the display device further includes a plurality of seventh connection members 707 extending from the seventh connection line 207 and a second linking member 750 connecting the plurality of seventh connection members 707 to each other. For example, the display device may include the seventh connection line 207, two seventh connection members 707 and the second linking member 750.

In an embodiment, the seventh clock line CL7, the seventh clock members 507 and the first linking member 550 are integrally formed (e.g., into a monolithic structure). In an embodiment, the seventh connection line 207, the seventh connection members 707 and the second linking member 750 are integrally formed (e.g., into a monolithic structure).

The seventh clock members 507 and the seventh connection members 707 are located on different layers. The seventh clock members 507 and the seventh connection members 707 are connected by a seventh conductive layer 907. A portion of the seventh conductive layer 907 is connected to the seventh clock member 507 through a seventh gate contact hole 337 and another portion of the seventh conductive layer 907 is connected to the seventh connection member 707 through a seventh source contact hole 357. The seventh gate contact hole 337 penetrates the gate insulating layer 411 and the protective layer 420. The seventh clock member 507 is exposed by the seventh gate contact hole 337. The seventh source contact hole 357 penetrates the protective layer 420. The seventh connection member 707 is exposed by the seventh source contact hole 357.

As illustrated in FIG. 2, the eighth clock line CL8 is connected to the gate driver 266 through an eighth connection line 208 and an eighth conductive layer 908. For example, the eighth connection line 208 connects the eighth clock line CL8 and the eighth stage ST8 of the gate driver 266. The eighth clock line CL8 transmits the eighth clock signal CK8.

The display device includes a plurality of eighth clock members 508 extending from the eighth clock line CL8 and a first linking member 550 connecting the plurality of eighth clock members 508 to each other. For example, the display device may include the eighth clock line CL8, two eighth clock members 508 and the first linking member 550.

In an embodiment, the display device further includes a plurality of eighth connection members 708 extending from the eighth connection line 208 and a second linking member 750 connecting the plurality of eighth connection members 708 to each other. For example, the display device may include the eighth connection line 208, two eighth connection members 708 and the second linking member 750.

In an embodiment, the eighth clock line CL8, the eighth clock members 508 and the first linking member 550 are integrally formed (e.g., into a monolithic structure). In an embodiment, the eighth connection line 208, the eighth connection members 708 and the second linking member 750 are integrally formed (e.g., into a monolithic structure).

The eighth clock members 508 and the eighth connection members 708 are located on different layers. The eighth clock members 508 and the eighth connection members 708 are connected by an eighth conductive layer 908. A portion of the eighth conductive layer 908 is connected to the eighth clock member 508 through an eighth gate contact hole 338 and another portion of the eighth conductive layer 908 is connected to the eighth connection member 708 through an eighth source contact hole 358. The eighth gate contact hole 338 penetrates the gate insulating layer 411 and the protective layer 420. The eighth clock member 508 is exposed by the eighth gate contact hole 338. The eighth source contact hole 358 penetrates the protective layer 420. The eighth connection member 708 is exposed by the eighth source contact hole 358.

The eighth clock line CL8 of the first, second, third, fourth, fifth, sixth, seventh and eighth clock lines CL1, CL2, CL3, CL4, CL5, CL6, CL7 and CL8 is located closest to the gate driver 266. A base line VSL and a start line STL are located between the eighth clock line CL8 and the gate driver 266.

The base line VSL is connected to each of the stages ST1, ST2, ST3, ST4, ST5, ST6, ST7 and ST8 of the gate driver 266. The base line VSL transmits a base voltage. The base voltage is a DC voltage. Each stage uses the base voltage to generate a low voltage of the gate signal. The base line VSL is located on a substantially same layer as a layer on which the first, second, third, fourth, fifth, sixth, seventh and eighth clock lines CL1, CL2, CL3, CL4, CL5, CL6, CL7 and CL8 are located. The base line VSL is connected to each of the stages ST1, ST2, ST3, ST4, ST5, ST6, ST7 and ST8 through a contact hole 372, a connection line 238 and a conductive layer 235.

The start line STL is connected to the first stage ST1 and a last stage. The start line STL is located on a substantially same layer as a layer on which the first, second, third, fourth, fifth, sixth, seventh and eighth clock lines CL1, CL2, CL3, CL4, CL5, CL6, CL7 and CL8 are located. The start line STL is connected to the first stage ST1 and the last stage through a contact hole 371, a connection line 233 and a conductive layer 239.

As illustrated in FIGS. 2 and 4, the first, second, third, fourth, fifth, sixth, seventh and eighth clock lines CL1, CL2, CL3, CL4, CL5, CL6, CL7 and CL8 are located on the first substrate 401 of the first panel 105. In an embodiment, although not illustrated, the first, second, third, fourth, fifth, sixth, seventh and eighth connection lines 201, 202, 203, 204, 205, 206, 207 and 208, the first, second, third, fourth, fifth, sixth, seventh and eighth clock members 501, 502, 503, 504, 505, 506, 507 and 508, the first, second, third, fourth, fifth, sixth, seventh and eighth connection members 701, 702, 703, 704, 705, 706, 707 and 708, the base line VSL and the start line STL are also located on the first substrate 401. The first panel 105 includes the gate insulating layer 411 and the protective layer 420 in addition to the first substrate 401.

The gate insulating layer 411 is located on the first, second, third, fourth, fifth, sixth, seventh and eighth clock lines CL1, CL2, CL3, CL4, CL5, CL6, CL7 and CL8, the first, second, third, fourth, fifth, sixth, seventh and eighth clock members 501, 502, 503, 504, 505, 506, 507 and 508, the first linking members 550, the base line VSL and the start line STL, and the protective layer 420 is located on the first, second, third, fourth, fifth, sixth, seventh and eighth connection lines 201, 202, 203, 204, 205, 206, 207 and 208 and the first, second, third, fourth, fifth, sixth, seventh and eighth connection members 701, 702, 703, 704, 705, 706, 707 and 708 and the gate insulating layer 411.

As illustrated in FIG. 4, the second panel 106 includes a second substrate 402, a light shielding layer 476, and a common electrode 430. The light shielding layer 476 is located on the second substrate 402, and the common electrode 430 is located on the light shielding layer 476. The common electrode 430 is located on an entire surface of the second substrate 402 including the light shielding layer 476. The first, second, third, fourth, fifth, sixth, seventh and eighth clock lines CL1, CL2, CL3, CL4, CL5, CL6, CL7 and CL8 of the first substrate 401, the first, second, third, fourth, fifth, sixth, seventh and eighth connection lines 201, 202, 203, 204, 205, 206, 207 and 208, the first, second, third, fourth, fifth, sixth, seventh and eighth clock members 501, 502, 503, 504, 505, 506, 507 and 508, the first, second, third, fourth, fifth, sixth, seventh and eighth connection members 701, 702, 703, 704, 705, 706, 707 and 708, the base line VSL, the start line STL and the gate driver 266 overlap the common electrode 430 of the second substrate 402.

A liquid crystal layer 433 is located between the first panel 105 and the second panel 106.

Figure 5:
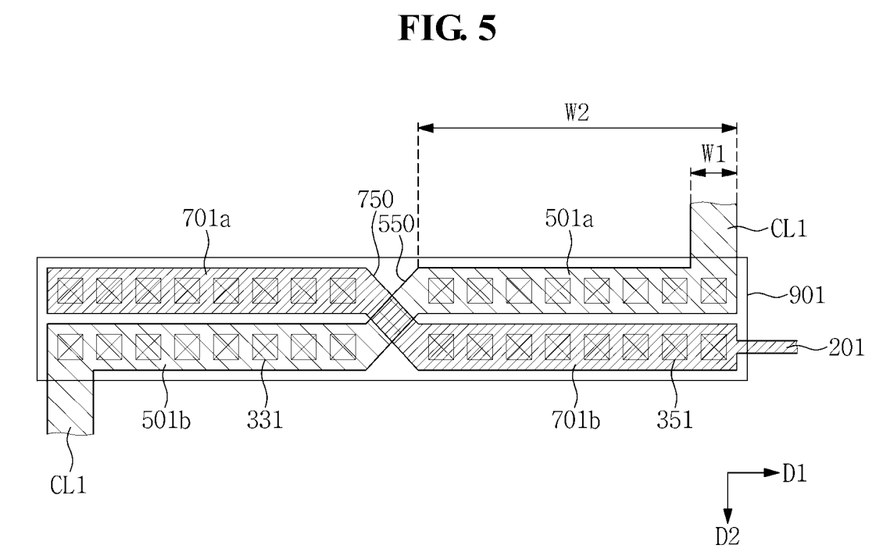
FIG. 5 is a view illustrating an area "A" of FIG. 2 according to an embodiment.

FIG. 5 is a view illustrating an area "A" of FIG. 2.

The display device includes two first clock members 501a and 501b extending from the first clock line CL1 and includes the first linking member 550 connecting the two first clock members 501a and 501b.

In an embodiment, the display device further includes two first connection members 701a and 701b extending from the first connection line 201 and includes the second linking member 750 connecting the two first connection members 701a and 701b.

In an embodiment, the first clock line CL1, the first clock members 501a and 501b and the first linking member 550 are integrally formed (e.g., into a monolithic/continuous clock-signal structure). In an embodiment, the first connection line 201, the first connection members 701a and 701b and the second linking member 750 are integrally formed (e.g., into a monolithic/continuous connection structure).

Two first clock lines CL1 may be respectively connected to ends of the two first clock members 501a and 501b. In an embodiment, one or more first clock lines CL1 may be connected to one or more of the first clock members 501a and 501b in a region adjacent to the first linking member 550. In an embodiment, the first connection line 201 is connected to an end of the first connection member 701b.

The first linking member 550 and the second linking member 750 intersect each other in a plan view of the display device, and the first clock members 501a and 501b and the first connection members 701a and 701b are spaced from one another in the plan view of the display device. In an embodiment, the first clock line CL1 and the first connection line 201 do not overlap each other.

Each of the two first clock members 501a and 501b is connected to the first conductive layer 901 through a plurality of first gate contact holes 331. In an embodiment, each of the two first connection members 701a and 701b is connected to the first conductive layer 901 through a plurality of first source contact holes 351. In an embodiment, the number of the first gate contact holes 331 and the number of the first source contact holes 351 may be configured in consideration of the size of the display panel, the area of the non-display area, the width of the wiring, and the like.

A width W1 of the first clock line CL1 in the first direction D1 is less than a width W2 of a first clock member 501a or 501b in the first direction D1. For example, a ratio between the width W1 and the width W2 may be in a range from about 1:2 to about 1:10. The width W1 may be in a range from about 20 μm to about 30 μm.

In an embodiment, the two first clock members 501a and 501b may have a substantially same width. In an embodiment, the two first clock members 501a and 501b may be formed with different widths. In an embodiment, each of the first connection members 701a and 701b may have a substantially same width as the width of each of the first clock members 501a and 501b. In an embodiment, the first connection members 701a and 701b and the first clock members 501a and 501b may have different widths.

As the display device according to an embodiment includes the plurality of first clock members 501a and 501b and the first linking member 550, an overlap area of the first conductive layer 901 with the first clock members 501a and 501b and the first linking member 550 may be sufficiently large. In an embodiment, as the display device includes the plurality of first connection members 701a and 701b and the second linking member 750, an overlap area of the first conductive layer 901 with the plurality of first connection members 701a and 701b and the second linking member 750 may be sufficiently large.

Accordingly, the plurality of first gate contact holes 331 may be positioned on the first clock member 501, and the plurality of first source contact holes 351 may be positioned on the first connection member 701. Advantageously, by maximizing the numbers of the contact holes in the display device according to an embodiment, the charge transfer efficiency may be maximized, and/or the heat generation in the non-display area may be minimized.

Figure 6:
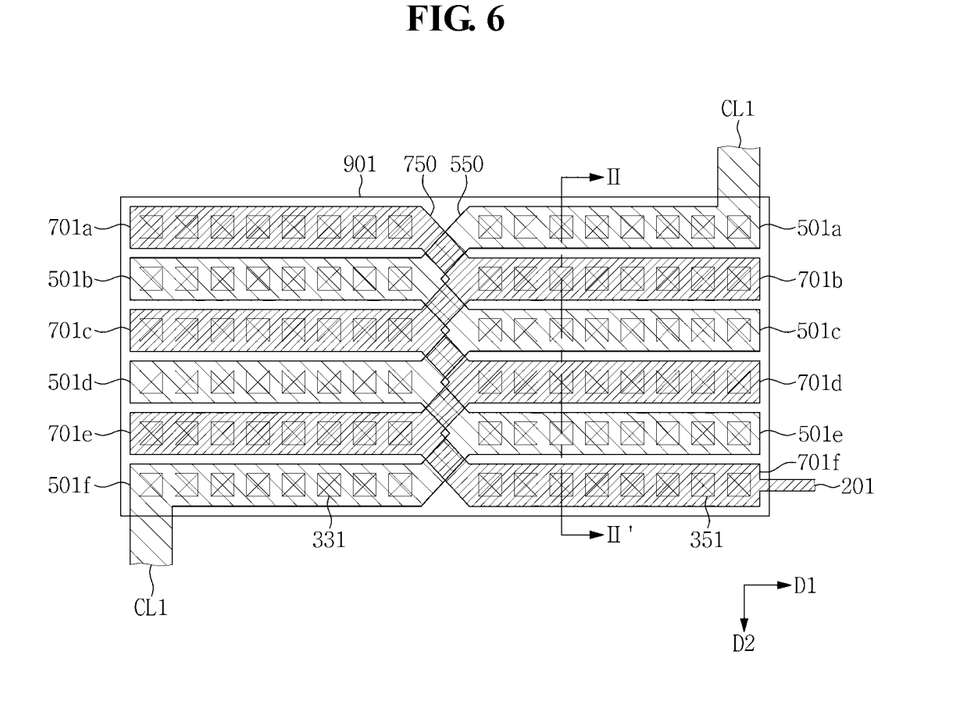
FIG. 6 is a view corresponding to the area "A" of FIG. 2 according to an embodiment.
Figure 7:
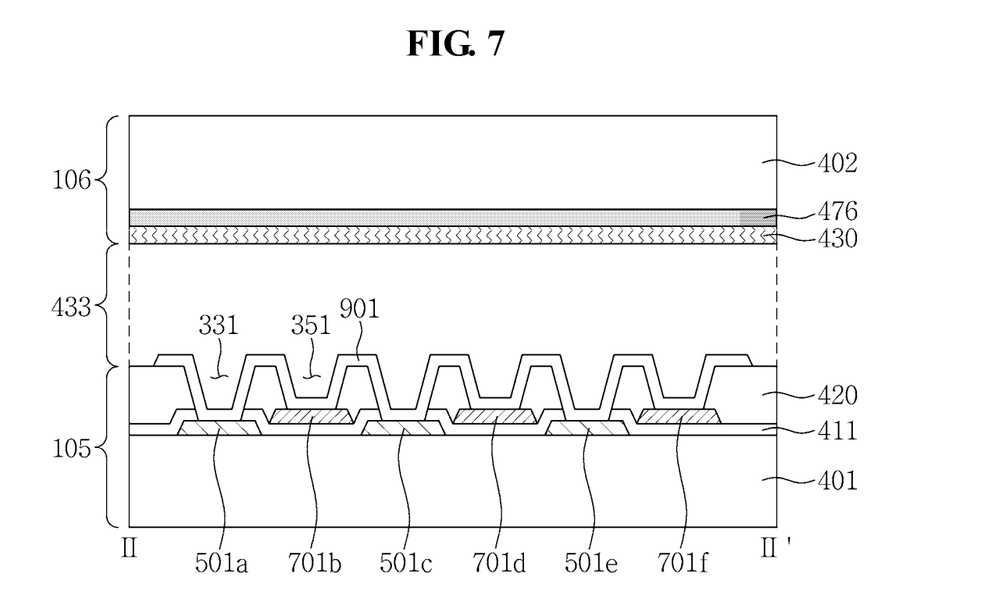
FIG. 7 is a cross-sectional view taken along line II-II' of FIG. 6 according to an embodiment.

FIG. 6 is a view corresponding to the area "A" of FIG. 2 according to an embodiment, and FIG. 7 is a cross-sectional view taken along line II-II' of FIG. 6 according to an embodiment.

Referring to FIGS. 6 and 7, the display device includes a plurality of first clock members 501a, 501b, 501c, 501d, 501e and 501f extending from a first clock line CL1 and includes a first linking member 550 electrically connecting the plurality of first clock members 501a, 501b, 501c, 501d, 501e and 501f to each other. For example, as illustrated in FIG. 6, the display device includes a clock-signal structure that includes the first clock line CL1, six first clock members 501a, 501b, 501c, 501d, 501e and 501f, and the first linking member 550 connecting adjacent ones of the six first clock members 501a, 501b, 501c, 501d, 501e and 501f.

In an embodiment, the display device further includes a plurality of first connection members 701a, 701b, 701c, 701d, 701e and 701f extending from a first connection line 201 and includes a second linking member 750 connecting the plurality of first connection members 701a, 701b, 701c, 701d, 701e and 701f to each other. For example, as illustrated in FIG. 6, the display device includes a connection structure that includes the first connection line 201, six first connection members 701a, 701b, 701c, 701d, 701e and 701f and the second linking member 750 connecting adjacent ones of the six first connection members 701a, 701b, 701c, 701d, 701e and 701f.

In an embodiment, the first clock line CL1, the plurality of first clock members 501a, 501b, 501c, 501d, 501e and 501f and the first linking member 550 are integrally formed (e.g., into a monolithic/continuous clock-signal structure). In an embodiment, the first connection line 201, the plurality of first connection members 701a, 701b, 701c, 701d, 701e and 701f and the second linking member 750 are integrally formed (e.g., into a monolithic/continuous connection structure).

The first linking member 550 and the second linking member 750 may each have a zigzag structure. The first linking member 550 and the second linking member 750 intersect each other in a plan view of the display device and overlap each other. In an embodiment, as the first linking member 550 connects adjacent ones of the six first clock members 501a, 501b, 501c, 501d, 501e and 501f, and as the second linking member 750 connects adjacent ones of the six first connection members 701a, 701b, 701c, 701d, 701e and 701f, the first linking member 550 and the second linking member 750 may cross five times and/or at five positions.

The first clock members 501a, 501b, 501c, 501d, 501e and 501f and the first connection members 701a, 701b, 701c, 701d, 701e and 701f do not overlap each other. For example, as illustrated in FIG. 6, the first clock members 501a, 501b, 501c, 501d, 501e and 501f are arranged in an alternate manner on the left and right sides with respect to the first linking member 550 and the second linking member 750. In an embodiment, the first connection members 701a, 701b, 701c, 701d, 701e and 701f are arranged in an alternate manner on the left and right sides with respect to the first linking member 550 and the second linking member 750. In an embodiment, the first connection members 701a, 701b, 701c, 701d, 701e and 701f are arranged alternately so as not to overlap the first clock members 501a, 501b, 501c, 501d, 501e and 501f.

Each of the first clock members 501a, 501b, 501c, 501d, 501e and 501f is connected to a first conductive layer 901 through a plurality of first gate contact holes 331. In an embodiment, each of the first connection members 701a, 701b, 701c, 701d, 701e and 701f is connected to the first conductive layer 901 through a plurality of first source contact holes 351. In an embodiment, the number of the first gate contact holes 331 and the number of the first source contact holes 351 may be configured in consideration of the size of the display panel, the area of the non-display area, the width of the wiring, and the like.

As the display device includes the plurality of first clock members 501a, 501b, 501c, 501d, 501e and 501f and the first linking member 550, an overlap area of the first conductive layer 901 and the first clock members 501a, 501b, 501c, 501d, 501e and 501f and the first linking member 550 may be sufficiently large. In an embodiment, as the display device includes the plurality of first connection members 701a, 701b, 701c, 701d, 701e and 701f and the second linking member 750, an overlap area of the first conductive layer 901 with the first connection members 701a, 701b, 701c, 701d, 701e and 701f and the second linking member 750 may be sufficiently large.

Accordingly, a plurality of first gate contact holes 331 may be positioned on the first clock member 501, and a plurality of first source contact holes 351 may be positioned on the first connection member 701. Advantageously, as the display device includes the plurality of contact holes, the charge transfer efficiency may be maximized, and/or the heat generation in the non-display area may be minimized.

As set forth hereinabove, according to one or more embodiments, an overlap area between each clock line and the conductive layer may be maximized due to the clock member and the first linking member, and an overlap area between each connection line and the conductive layer may be maximized due to the connection member and the second linking member. Advantageously, a plurality of contact holes may be implemented, and charge transfer efficiency may be maximized.

In an embodiment, heat generation may be minimized in the non-display area.

While example embodiments have been illustrated and described, various changes in form and detail may be implemented without departing from the spirit and scope of the embodiments.

What is claimed is:

1. A display device comprising:
a substrate;
a gate line extending in a first direction and overlapping the substrate;
a gate driver electrically connected to the gate line;
a clock-signal structure configured for transmitting a clock signal and comprising a plurality of clock members and a first linking member, wherein the first linking member electrically connects the plurality of clock members to each other and is angled relative to the plurality of clock members;
a connection structure electrically connecting the clock-signal structure and the gate driver and comprising a plurality of connection members and a second linking member, wherein the second linking member electrically connects the plurality of connection members to each other, is angled relative to the plurality of connection members, and crosses the first linking member; and
a conductive layer electrically connecting the plurality of clock members to the plurality of connection members,
wherein the plurality of clock members and the plurality of connection members are located on different layers.

2. The display device of claim 1, wherein each of the plurality of clock members is spaced from each of the plurality of connection members in a plan view of the display device.

3. The display device of claim 1, wherein the first linking member and the second linking member have a zigzag shape in a plan view of the display device.

4. The display device of claim 1, wherein the plurality of clock members are arranged alternately on left and right sides with respect to the first linking member and the second linking member.

5. The display device of claim 1, wherein the plurality of connection members are arranged alternately on left and right sides with respect to the first linking member and the second linking member.

6. The display device of claim 1, further comprising:
a gate insulating layer directly contacting each of the substrate and the clock-signal structure;
a protective layer directly contacting each of the gate insulating layer and the connection structure; and
a conductive layer directly contacting each of the plurality of clock members and the plurality of connection member.

7. The display device of claim 6, wherein the gate insulating layer and the protective layer have a plurality of first-type contact holes, and
wherein the conductive layer contacts the plurality of clock members through the first-type contact holes.

8. The display device of claim 7, wherein portions of the conductive layer are respectively positioned inside the first-type contact holes.

9. The display device of claim 6, wherein the protective layer has a plurality of second-type contact holes, and
wherein the conductive layer contacts the plurality of connection members through the second-type contact holes.

10. The display device of claim 9, wherein parts of the conductive layer are respectively positioned inside the second-type contact holes.

11. The display device of claim 1, wherein the clock-signal structure comprises a clock line, wherein a width of the clock line in the first direction is less than a width of one of the plurality of clock members in the first direction.

12. The display device of claim 11, wherein a ratio between the width of the clock line in the first direction and the width of one of the plurality of clock members in the first direction is in a range from 1:2 to 1:10.

13. The display device of claim 11, wherein the width of the clock line in the first direction is in a range from 20 μm to 30 μm.

14. The display device of claim 1, wherein the clock-signal structure directly contacts a face of the substrate, and wherein the gate line directly contacts the face of the substrate.

15. The display device of claim 1,
wherein the plurality of clock members extend parallel to one another, and are not aligned with one another in the first direction in a plan view of the display device.

16. The display device of claim 1,
wherein the plurality of connection members extend parallel to one another, and are not aligned with one another in the first direction in a plan view of the display device.

17. The display device of claim 1,
wherein the plurality of clock members are respectively aligned with the plurality of connection members in the first direction in a plan view of the display device.

18. The display device of claim 17,
wherein the plurality of clock members and the plurality of connection members are alternately disposed in a second direction perpendicular to the first direction in a plan view of the display device.

* * * * *